Nov. 25, 1969 M. BLOOM 3,480,535

SPUTTER DEPOSITING SEMICONDUCTOR MATERIAL AND FORMING SEMICONDUCTOR JUNCTIONS THROUGH A MOLTEN LAYER

Filed July 7, 1966

INVENTOR.
MURRAY BLOOM
BY Arthur Frielich
ATTORNEY 3,480,535

SPUTTER DEPOSITING SEMICONDUCTOR MATERIAL AND FORMING SEMICONDUCTOR JUNCTIONS THROUGH A MOLTEN LAYER

Murray Bloom, Los Angeles, Calif., assignor to TRW Inc., Redondo Beach, Calif., a corporation of Ohio Filed July 7, 1966, Ser. No. 563,467
Int. Cl. C23c *15/00*
U.S. Cl. 204—192 6 Claims

ABSTRACT OF THE DISCLOSURE

There is disclosed a method and apparatus for sputter depositing a layer of semiconductor material from a cathode onto a semiconductor substrate through a molten metal alloy layer on the substrate. The surface of the molten layer away from the substrate is at a higher temperature which is above the melting point of the sputtered semiconductor so that it will go into solution, whereas the temperature of the surface of the substrate contacting the bottom of the alloy layer is below the melting point of the sputtered material so that it will crystallize out of solution and deposit onto the substrate. If the sputtered semiconductor is of the opposite conductivity type from the semiconductor substrate a very efficient method of establishing a p–n junction without diffusion into the substrate is afforded.

This invention relates generally to methods of fabricating semiconductor devices and more particularly to improvements relating to the deposition of epitaxial layers of semiconductor material useful, for example, for forming semiconductor junctions.

Various methods are known in the prior art suitable for depositing epitaxial layers of semiconductor material, e.g. silicon. Although many of these methods are suitable for certain applications, they are often unsatisfactory for other applications. For example, in the formation of junctions between different types of silicon, it is usually desired to control diffusion. If the heat required by the deposition method is too great, unwanted diffusion may result. Aside from temperature considerations, prior art methods are often unsatisfactory because they require the use of extremely expensive equipment, for example, in order to develop extremely high vacuums.

In accordance with a first aspect of the present invention, an improved method for depositing epitaxial layers of semiconductor material, such as silicon, is provided which method involves sputtering silicon from a cathode and depositing onto a substrate through a molten alloy layer (e.g. gold-silicon eutectic) supported on the substrate. By maintaining a temperature gradient through the alloy layer, silicon will be grown adjacent the cooler side of the alloy layer as silicon is added (by sputtering) to its hotter side.

In accordance with a second aspect of the invention, it is recognized that junctions can be formed by depositing a first type of material through a liquid alloy layer onto a substrate of another material type. Although, in accordance with the preferred method of practicing the invention, junctions are formed by depositing by sputtering, it is pointed out that other methods of deposition (e.g. sublimation, reduction, evaporation) can be used to form junctions by depositing through a liquid alloy layer.

The novel features that are considered characteristic of this invention are set forth with particularity in the appended claims. The invention will best be understood from the following description when read in connection with the accompanying drawings, in which:

Figure 1:
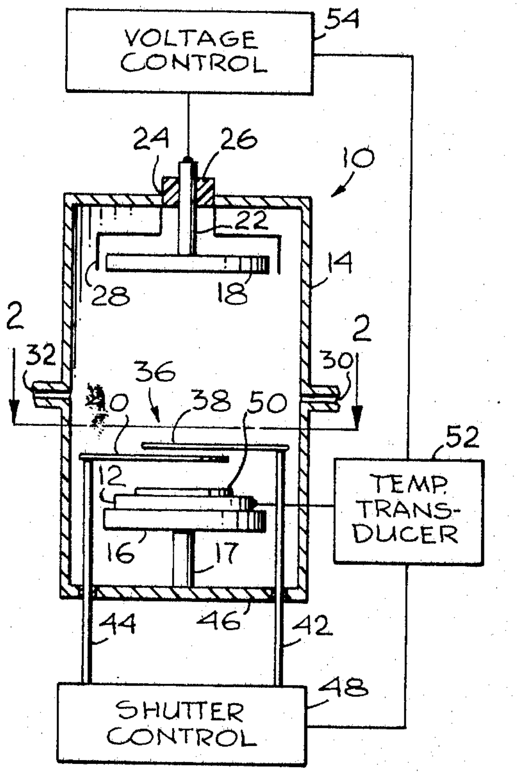
FIGURE 1 is a sectional view illustrating a sputtering apparatus in accordance with the present invention.

Attention is now called to FIGURE 1 which illustrates a sectional view of a sputtering apparatus 10 suitable for depositing semiconductor material, such as silicon, onto a substrate 12 supported within the apparatus 10. Typically, but not necessarily, the substrate 12 is formed of semiconductor material such as silicon.

More particularly, the sputtering apparatus 10 is comprised of a cylindrical housing or chamber 14 formed of a conductive material, for example, aluminum. An anode 16 is supported within and electrically connected to the housing by a conductive stem 17. A cathode 18 is also disposed in the housing spaced from and opposed to the anode 16. The cathode is formed of a material of the conductivity type and resistivity desired to be deposited on the substrate. A conductive stem 22 physically and electrically connected to the cathode 18, extends through an opening 24 in the end wall of the housing 14. The stem 22 is insulated from the housing 24 by a vacuum-tight insulating collar 26. A portion 28 of the housing projects inwardly around the cathode 18 to shield the cathode and stem 22.

In addition to the foregoing, the housing 14 is provided with an inlet aperture 30 and an exhaust aperture 32. The exhaust aperture 32 is used to evacuate the housing. The inlet aperture 30 is used to enable gas to be leaked into the housing.

The sputtering apparatus 10 described thus far is substantially conventional. In order to use the sputtering apparatus 10 to practice the method in accordance with the present invention, the apparatus is provided with a shutter mechanism 36 disposed between the anode 16 and cathode 18, preferably close to where the substrate is to be supported. The shutter mechanism 36 is comprised of overlapping plates 38 and 40 which can be respectively mounted on rotatable shafts 42 and 44. The shafts 42 and 44 are journalled through the wall 46 of the sputtering chamber and are controlled by a shutter control apparatus 48. Thus, the shutter mechanism 36 can either be in a closed position so that it shields the substrate 12 from the cathode 18 or in an open position so that it is exposed to the cathode 18.

It has long been known that certain semiconductor materials, e.g. silicon, can be grown at the cooler surface of a molten layer of certain eutectics, in response to that material being added to the hotter surface of the eutectic. In accordance with a preferred form of the invention, silicon released by sputtering from a silicon cathode is deposited onto the substrate 12 through a gold-silicon eutectic.

More particularly, in order to deposit an epitaxial layer of silicon onto the substrate, a layer of metal 50 capable of alloying with the substrate material is affixed thereto. Assuming the substrate material to be silicon, various metals including gold, silver, copper, indium, tin, aluminum and other metals can be employed. The layer 50 can be very thin, e.g. on the order of 1500 A.

Figure 2:
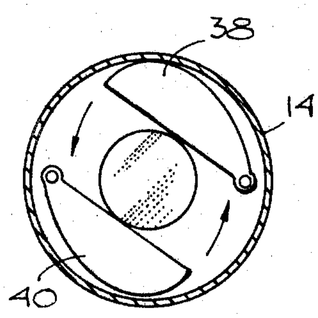
FIGURE 2 is a sectional view taken substantially along the plane 2—2 of FIGURE 1.
Figures 3A, 3B, 3C, 3D, 3E, 3F:
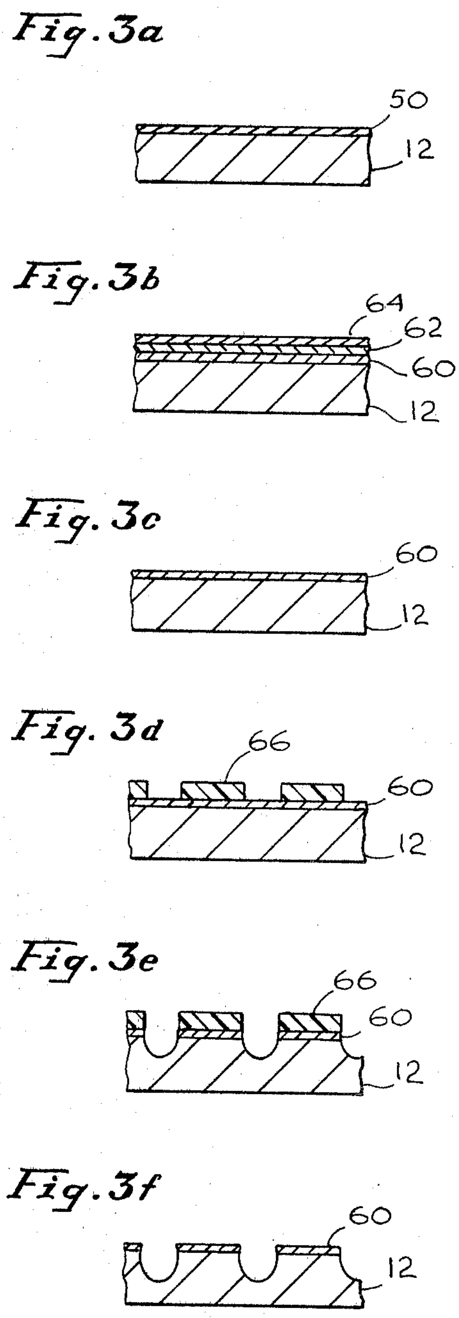
FIGURE 3 schematically illustrates various steps in practicing the fabrication method in accordance with the present invention.

In order to appreciate how the apparatus 10 of FIGURES 1 and 2 is utilized to deposit an epitaxial silicon layer on the substrate 12, attention is called to FIGURE 3 which illustrates a sequence of fabrication steps. FIGURE 3*a* comprises a cross-section of the silicon substrate 12 illustrating a thin gold layer 50 thereon. The gold 50 can be deposited on the silicon substrate 12 by sputtering from a gold cathode utilizing a pressure of approximately 200 microns for one hour at 400–460° C.

In order to form an epitaxial silicon layer on the substrate 12, the substrate with the gold layer 50 thereon is supported between the cathode 18 and anode 16; e.g. on the anode 16 as shown in FIGURE 1. Then, utilizing a silicon cathode and with the shutter mechanism 36 initially closed to shield the metal layer 50 from the cathode, an electrical potential on the order of 5000 volts is applied between the anode and cathode. Assuming an appropriate gas pressure within the sputtering chamber, a discharge will be established which heats the gas within the chamber which in turn of course heats the substrate 12. A temperature transducer 52 monitors the substrate temperature (which is approximately the same as the alloy temperature) and when it reaches a value (e.g. 400° C., for a gold silicon alloy) sufficient to form a molten alloy layer, the transducer 52 operates the shutter control 48 to thereby open the shutter mechanism 36. As a consequence, silicon atoms sputtered from the cathode will be collected on the upper surface (i.e. the surface closest to the cathode of the molten alloy layer). Inasmuch as the aluminum anode 16 and stem connecting it to the chamber wall 14 act as a heat sink, there will be a temperature gradient through the molten alloy layer such that its lower surface adjacent the substrate 12 will be cooler than its upper surface. As a consequence, silicon will be grown at the boundary between the alloy layer and the substrate 12 as shown in FIGURE 3*b*.

In addition to controlling the shutter control 48, the temperature transducer 52 controls a voltage control device 54 to maintain the substrate temperature at a constant value, e.g. 400° C., during the deposition of silicon.

As a consequence of depositing silicon in the manner aforedescribed, the substrate 12, as shown in FIGURE 3*b*, will have an epitaxial silicon layer 60 formed on one surface thereof with a gold silicon eutectic 62 thereover with a layer of gold 64 on top of the eutectic. By then soaking the structure of FIGURE 3*c* in aqua regia for a sufficient period (e.g. 15 hours), the gold layer 64 and gold silicon eutectic 62 will be removed leaving only the epitaxial silicon layer 60 on the substrate 12 as shown in FIGURE 3*c*. A mask 66, which can be formed of a photoresist material, is then deposited over the epitaxial silicon layer 60 in the desired pattern as shown in FIGURE 3*d*. Then, utilizing an appropriate etchant, the substrate can be etched in order to form mesas as shown in FIGURE 3*e*. Subsequently, a solvent can be employed to remove the photoresist mask to provide the structure as shown in FIGURE 3*f*. It can be noted in FIGURE 3*f* that a plurality of mesas are defined which are structurally interconnected by thin portions of the substrate. These thin portions can be easily severed by various means to thus provide a plurality of individual semiconductor devices.

Utilization of the apparatus of FIGURE 1 in the manner described deposits an epitaxial layer of silicon of the resistivity and conductivity type corresponding to the silicon cathode on the upper surface of the substrate. Experiments indicate that the method and apparatus of FIGURE 1 enables silicon of any type to be deposited on substrates of various materials including all types of silicon.

It is significant to note that by utilizing a substrate of one type of silicon material and a cathode of another type of silicon material, silicon junctions can be formed. More particularly, a PN junction can be formed for example by utilizing a P type substrate and a cathode formed of N type silicon. It has been found that junctions formed in this manner exhibit excellent electrical properties; for example, mesas formed in accordance with the method steps of FIGURE 3, exhibit a sharp breakdown with a reverse voltage of 70 volts. Reverse current at just less than 70 volts was less than one microampere. Forward conduction commenced at approximately .6 volt.

Because of the relatively low temperature and short time required to deposit silicon according to the aforedescribed method, very little diffusion takes place and hence the method appears to be well suited to the fabrication of plane emitters for example. If conventional epitaxial deposition by the reduction of a silane were used, the high temperatures required would result in a certain amount of diffusion thereby adversely affecting the formation of a plane emitter.

From the foregoing, it should be appreciated that a method of fabricating an epitaxial layer of silicon by sputtering a silicon cathode and depositing the sputtered silicon through a molten alloy layer has been disclosed herein. The method in accordance with the invention has several characteristics which make it attractive as compared to other prior art methods. Primarily, it requires only relatively moderate temperatures of between 400° C. and 500° C., and only moderate vacuums of approximately 200 microinches. As a consequence of these characteristics, it is particularly attractive for forming semiconductor junctions since the absence of very high temperatures avoids problems of unwanted diffusion. Although sputtering in accordance with the invention represents a preferred manner of forming junctions, it is recognized that junctions can be formed by depositing silicon through a molten alloy layer wherein the silicon is liberated from the cathode by means other than sputtering, e.g. sublimation, reduction, evaporation.

What is claimed is:

1. A method of operating a sputtering apparatus, comprised of an enclosed chamber containing an ionizable gas and including an anode and a semiconductor cathode, for depositing a layer of cathode material on a semiconductor substrate, said method including the steps of:

providing a layer of metal capable of alloying with said semiconductor substrate on said substrate;

applying a potential across said anode and cathode sufficient to ionize said gas to thereby liberate atoms from said cathode and heat said substrate and layer of metal to form a molten alloy layer;

establishing a temperature gradient through said molten alloy layer such that the surface of said alloy layer adjacent said substrate is cooler than the alloy layer surface remote from said substrate and at a temperature lower than the melting point of said cathode material; and collecting said liberated atoms at said alloy layer surface remote from said substrate.

2. The method of claim 1 including the additional steps of determining the temperature of said substrate; and preventing said liberated atoms from collecting on said alloy layer until said substrate temperature reaches a predetermined value.

3. The method of claim 1 including the step of employing different types of semiconductor material for said cathode and said substrate.

4. The method of claim 1 including the additional steps of determining the temperature of said substrate; and adjusting said potential applied across said anode and cathode to maintain said substrate temperature at a predetermined value.

5. A method of operating a sputtering apparatus comprised of an enclosed chamber containing an ionizable gas and including an anode and cathode to form a semiconductor p-n junction, said method including the steps of:

(a) providing a first conductivity type semiconductor material at said cathode and providing a substrate consisting of a second conductivity type semiconductor at said anode;

(b) thereafter providing a layer of metal on said substrate which is capable of alloying with said semiconductor substrate;

(c) applying a potential across said anode and cathode sufficient to ionize said gas to thereby liberate atoms from said cathode and heat said substrate and said layer of metal to form a molten alloy layer;

(d) establishing a temperature gradient through said molten alloy layer such that the surface of said alloy layer adjacent to said substrate is cooler than the alloy layer surface remote from said substrate and at a temperature lower than the melting point of said first conductivity type semiconductor; and (e) collecting said liberated atoms at said alloy layer surface remote from said substrate to permit them to enter said molten alloy at said surface and to crystallize out of said molten alloy onto said substrate.

6. A method of forming a p-n semiconductor junction comprising the steps of:

(a) providing a substrate of semiconductor material of a first conductivity type;

(b) providing a layer of metal on said substrate which is capable of alloying with said substrate;

(c) heating said metal to form a molten alloy layer on said substrate and maintaining a temperature gradient through said molten alloy layer such that the surface of said alloy layer adjacent to said substrate is cooler than the alloy layer surface remote from said substrate; and (d) sputter depositing semiconductor material of a second conductivity type onto said substrate through said molten layer, the cooler temperature adjacent the substrate being maintained lower than the melting point of the second conductivity semiconductor material.

References Cited

UNITED STATES PATENTS

| | | | |
|---|---|---|---|
| 3,093,517 | 6/1963 | Lyons | 148—171 |
| 3,370,980 | 2/1968 | Anderson | 148—1.6 |
| 3,372,069 | 3/1968 | Bailey et al. | 148—1.6 |

JOHN H. MACK, Primary Examiner

SIDNEY S. KANTER, Assistant Examiner

U.S. Cl. X.R.

148—171